United States Patent [19]
Bersin et al.

[11] Patent Number: 5,882,489
[45] Date of Patent: Mar. 16, 1999

[54] PROCESSES FOR CLEANING AND STRIPPING PHOTORESIST FROM SURFACES OF SEMICONDUCTOR WAFERS

[75] Inventors: Richard L. Bersin, Lawrence; Han Xu, Lexington, both of Mass.

[73] Assignee: Ulvac Technologies, Inc., Methuen, Mass.

[21] Appl. No.: 638,279

[22] Filed: Apr. 26, 1996

[51] Int. Cl.[6] .............................. C23C 14/34; C23F 1/00; H01L 21/3065

[52] U.S. Cl. ................................ 204/192.35; 204/192.32; 216/18; 216/39; 216/41; 216/67; 216/69; 438/694; 438/700; 438/703; 438/706; 438/710; 438/725; 438/726; 438/727

[58] Field of Search ......................... 204/192.32, 192.35, 204/192.36, 192.37; 438/694, 700, 702, 703, 706, 707, 710, 725, 726, 727; 216/18, 39, 41, 46, 63, 67, 69; 427/97

[56] References Cited

U.S. PATENT DOCUMENTS

| | | | |
|---|---|---|---|
| 4,357,203 | 11/1982 | Zelez | 156/643 |
| 4,673,456 | 6/1987 | Spencer et al. | 156/345 |
| 4,804,431 | 2/1989 | Ribner | 156/345 |
| 5,380,401 | 1/1995 | Jones et al. | 156/665 |
| 5,661,083 | 8/1997 | Chen et al. | 438/702 |

OTHER PUBLICATIONS

Krongelb, "Control of Edge Build-up in Sputter Etching and Ion Milling", IBM Tech. Discl. Bulletin, vol. 21, No. 3, p. 1253–1255.

Jimbo et al., Japanese Journal of Applied Physics, vol. 32, No. 6b, Jun. 1993, Tokyo, pp. 3045–3050 "Resist Sidewall Film Removal after,Al Reactive Ion Etching (RIE) Employing F + H2O Downstream Ashing", Sec. 3.4.

Japanese Journal of Applied Physics, vol. 32, No. 6b, Jun. 1993, Tokyo, pp. 3045–3050, Jimbo et al. "Resist Sidewall Film Removal after Al Reactive Ion Etching (RIE) Employing F +$H_2O$Downstream ashing," Sec. 3.4.

Journal of the Electrochemical Society, vol. 137, No. 8, Aug. 1990, Manchester,, New Hampshire, pp. 2534–2538, XP000151176, Mayumi et al., "Post–Treatments for Reactive Ion Etching of Al–Si–Cu alloys".

Journal of the Electrochemical Society, vol. 141, No. 1, Jan. 1994, Manchester, New Hampshire, pp. 192–205, XP000445646, Hirose et al., "Ion–Implanted Photoresist and Damage–Free Stripping".

*Primary Examiner*—Nam Nguyen
*Assistant Examiner*—Rodney G. McDonald
*Attorney, Agent, or Firm*—Hale and Dorr LLP

[57] ABSTRACT

A method for removing a resist layer, particularly in via holes, includes plasma to remove organic compounds, rinsing the device in deionized water, and sputtering with argon to remove inorganic compounds. The order of rinsing and sputtering can be reversed. These methods avoid the use of acids and industrial solvents.

27 Claims, 3 Drawing Sheets

PROCESSES FOR CLEANING AND STRIPPING PHOTORESIST FROM SURFACES OF SEMICONDUCTOR WAFERS

FIELD OF THE INVENTION

This invention relates to the cleaning and stripping of photoresist from surfaces of semiconductor wafers during manufacturing.

BACKGROUND OF THE INVENTION

In the manufacture of a number of semiconductor devices on a wafer, photolithography steps and etching, thin film deposition, and/or ion implantation steps are alternately performed to build up the devices. The photolithography steps typically include steps of coating a wafer with a photoresist, typically an ultraviolet (UV) photosensitive organic material; exposing the photoresist through a mask; developing the resist; and etching the exposed resist to leave certain exposed areas on the wafer surface. Further processing steps, such as deposition, implantation, or etching can then be employed on the exposed areas.

Etching is typically performed with either a wet etching process in which the wafers are immersed in a chemical etchant; or a dry etching process, such as downstream microwave plasma etching or reactive ion etching (RIE). After photoresist is patterned on a surface and after further processing steps are performed in exposed areas, the photoresist is stripped. During such further processing steps, the nature of the photoresist mask can change from its initial state because it can become contaminated with other materials. If, for example, an etching process is performed in the exposed areas to form via holes, high temperatures and ion bombardment from the etching can alter the photoresist. Such changes to the photoresist can make it more difficult to remove, particularly if the contaminants are nonvolatile and insoluble.

While the removal of residues and contaminants has been a concern among manufacturers of the semiconductor devices, manufacturers of equipment that performs the stripping have generally concentrated on the removal of organic resist material. Removal of contaminants and residues has been performed with acids and organic solvents as mentioned, for example, in U.S. Pat. No. 5,360,995. Solvents of this general type include EKC-265, available from EKC Corp. of Hayward, California; and N-methylpyrollidone (NMP). Such solvents can be costly to obtain, hazardous to handle, and costly to dispose. It would be desirable to have equipment and processes for removing both organic resist and inorganic residues and contaminants without having to use acids or industrial solvents.

SUBJECT OF THE INVENTION

This present invention includes processes for removing organic resists and inorganic residues and contaminants, without the need for a step of acids and/or organic industrial solvents. These processes are preferably performed with a processing device such as that described in U.S. Pat. No. 5,228,052, which allows microwave downstream plasma etching or RIE to be performed alternatively or sequentially on wafers in a single process chamber.

In a first embodiment, the present invention includes a process including steps of ashing the organic resist from a device, rinsing the device in water, and sputtering the rinsed device to remove residual contaminants. In preferred embodiments, the stripping step is a dry etching process such as a microwave downstream process, an RIE process, or sequential or simultaneous microwave downstream and RIE processes; the rinsing step is performed with deionized (DI) water, and the sputtering step is performed with argon. This process is particularly useful for etching via holes when the holes penetrate a conductive layer and create insoluble, inorganic contaminants such as $AlF_3$.

In a second embodiment, a process includes steps of ashing the wafer with a microwave downstream process, ashing the wafer with a reactive ion etching process, and then rinsing the ashed device in water.

These processes eliminate the costly use and disposal of acids and organic solvents that have been previously employed, while resulting a pristine clean wafer. Other features and advantages will be apparent from the following detailed description, claims, and drawings.

DETAILED DESCRIPTION

Figure 1:
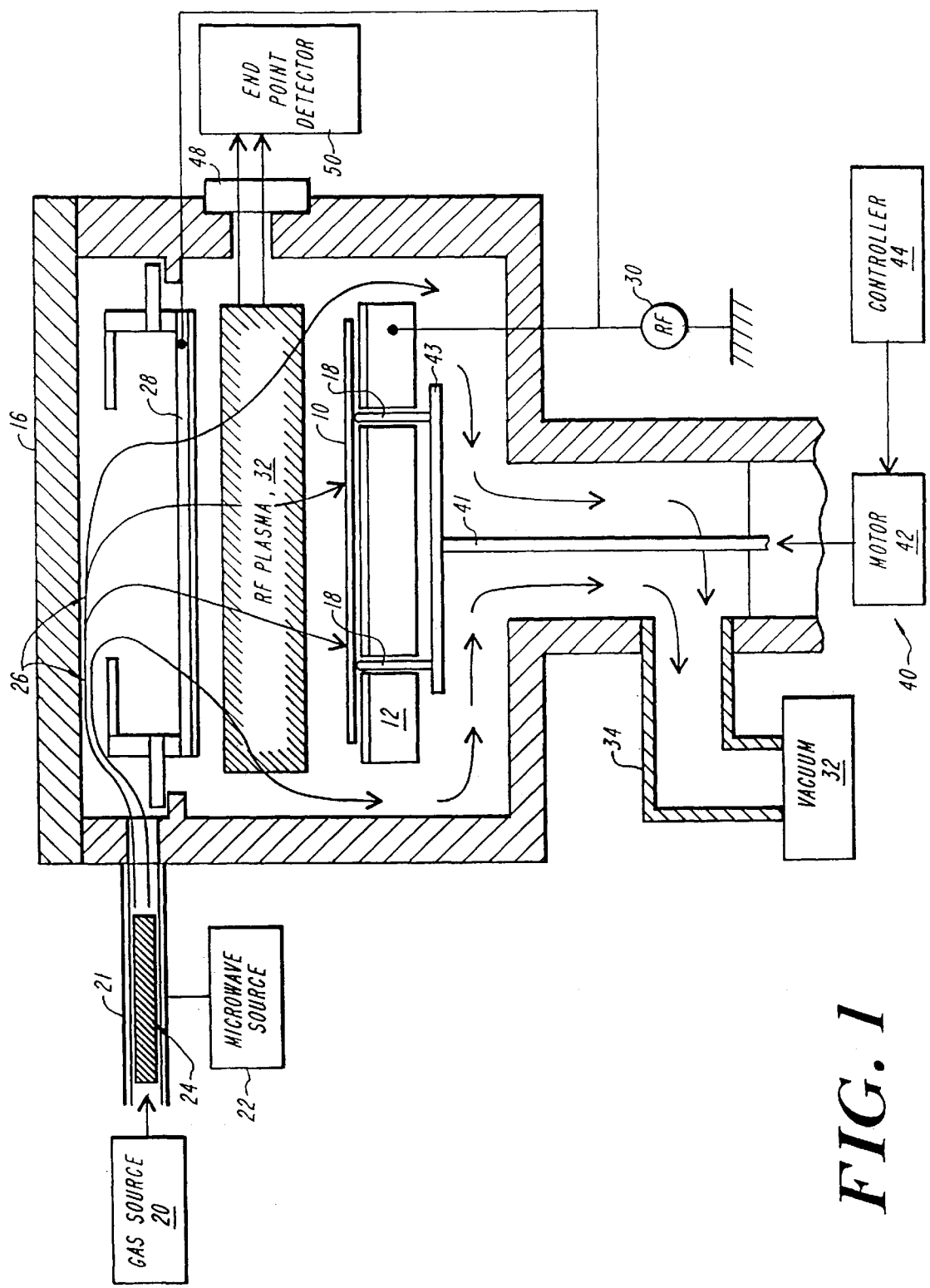
FIG. 1 is a partial pictorial, partial block diagram of an apparatus for etching and stripping.

Referring to FIG. 1, a semiconductor wafer 10 to be processed is positioned over a horizontally disposed hotplate 12 in an enclosed treatment chamber 16 for etching and/or cleaning. Wafer 10, which is typically flat and circular with a diameter of four to eight inches, rests horizontally on support pins 18 that extend through openings in hotplate 12 along its thickness direction. Wafer 10 and hotplate 12 thus lie in parallel horizontal planes.

A process gas is introduced into chamber 16 from a gas source 20 through an inlet pipe 21. A microwave source 22 at inlet pipe 21 causes a microwave plasma 24 to be formed at the inlet pipe, thus discharging a reactive gas 26 with a high concentration of active free radicals. Gas 26 passes through openings (not shown) in a top electrode 28 that is mounted above the wafer and is configured as in the incorporated patent. Under appropriate conditions, these active free radicals can thus decompose and evaporate a resist film on wafer 10 by converting the resist to gases. A vacuum 32 draws away these gases through an exhaust tube 34, and also maintains pressure on the order of 50–2000 mTorr in the chamber.

An RF source 30 is electrically coupled to top electrode 28 and to hotplate 12, which serves as a bottom electrode. Electrodes 28 and 12 thus form a double cathode. Source 30 provides an RF voltage that causes an RF plasma 32 to form over wafer 10. RF plasma 32 creates reactive ions that ash the resist from wafer 10.

A transparent cover 48 and an end point detector 50 are used to detect when ashing caused by the RF plasma begins and ends. End point detector 50 has a filter and an optical detector for detecting photons that are released in the RF plasma when OH radicals are formed during ashing.

A gas can be introduced from gas source 20 while microwave source 22 is activated to produce reactive gas 26 having a high concentration of free radicals discharged from the microwave plasma. An RF plasma can then be generated in the microwave-generated reactive gas 26 to ionize its free radicals. If, for example, a process gas from gas source 20 includes $CF_4$ and oxygen, the discharged gas from the microwave plasma has a high concentration of fluorine and oxygen radicals, respectively, in the gas over the wafer. If an RF plasma is then initiated in this discharge gas, the resulting ions that are produced are different from those in either the microwave discharge gas itself or from an RF plasma of $CF_4$ and oxygen gas without the microwave discharge. This different plasma has been found to substantially increase ashing during either etching or stripping.

Accordingly, chamber 16 can be used to perform dry ashing with a downstream microwave process, an RIE process, both of these processes simultaneously, or both of these processes sequentially and/or alternatively.

One process that can be performed with the device of FIG. 1 is the etching and cleaning of via holes formed through dielectric layers to facilitate interconnections in multilayer semiconductor devices. FIGS. 2(*a*) and 2(*b*) illustrate two known ways in which a via hole 66*a*, 66*b* is etched. A conductive layer 62*a*, 62*b*, typically aluminum or some alloy of aluminum or copper is covered with an anti-reflecting coating (ARC) 68*a*, 68*b*, such as titanium tungsten (TiW) or titanium nitride (TiN). A dielectric layer 60*a*, 60*b*, such as one or more layers of TEOS, PSG, or polyamide, is formed over conductive layer 62*a*, 62*b*. A blanket photoresist layer 64*a*, 64*b* is formed over dielectric layer 60*a*, 60*b*, and is developed to define exposed areas, such as small round area for via hole 66*a*, 66*b*. Next, dielectric layer 60*a*, 60*b* is etched, typically with an anisotropic process that uses fluoride, such as an RIE process, to produce gaseous compounds that are pumped away.

In a first method, etching stops at the surface of ARC 68*a* (FIG. 2(*a*)); and in a second method, etching proceeds through ARC 68*b* and into aluminum conductive layer 62*b* (FIG. 2(*b*)). With either of these methods, a polymer layer 70*a*, 70*b* forms around via hole 66*a*, 66*b*. The composition of polymer layer 70*a*, 70*b* is not consistent throughout, however, but varies depending on the depth of the etching and the surrounding layers.

As shown in FIG. 2(*a*), etching by-products that can contaminate photoresist layer 64*a* result from the etching of dielectric layer 60*a* and from etching small amounts of ARC 68*a* (which inevitably occurs because the holes are normally overetched to insure 100% removal of the dielectric material in the via hole), but not from conductive layer 62*a*.

Because ARC 68*a* typically has TiN, TiW, or some other similar material, and because the etching of dielectric layers 60*a* is normally done with a fluorine-based plasma, the by-products in layer 70*a* that also contaminate resist 64*a* are typically in the form of fluorides of titanium or tungsten. These fluorides are generally rather volatile and are very soluble in water.

Figure 2A:
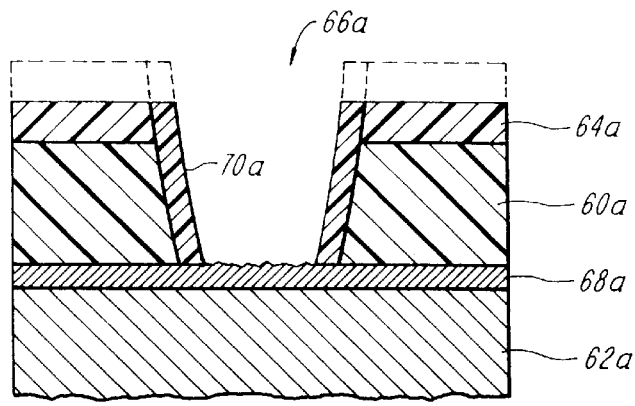
FIGS. 2(a) and 2(b) are cross-sectional views illustrating two known alternative ways in which via holes are made.
Figure 2B:
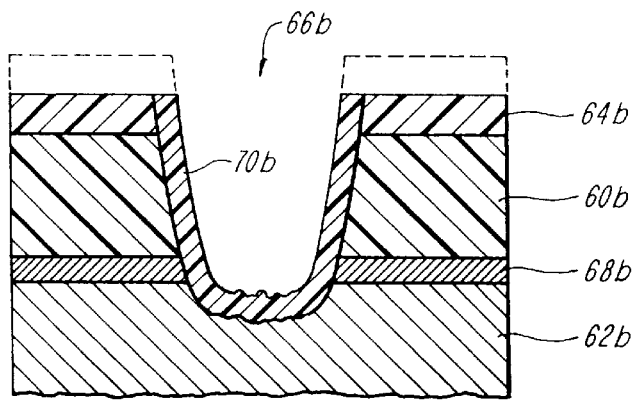
Figure 3:
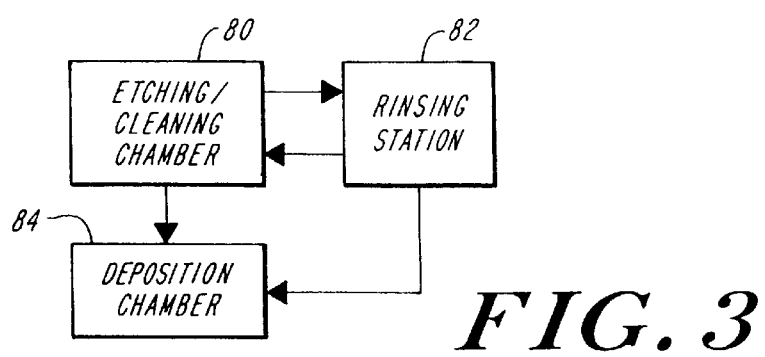
FIG. 3 is a block diagram illustrating processing steps.

Referring to FIG. 3, to strip resist from a via hole etched as shown in FIG. 2(*a*), one process according to the present invention includes providing a wafer in an etching and cleaning chamber 80, and plasma etching, preferably with one of two processes termed Hal and NoHal. These processes were developed by the assignee of the present invention and are described in more detail below. Next, an RIE step is performed with fluorine, typically from a gas such as $CF_4$ or $NF_3$. This plasma can be mixed with a forming gas, if desired, to provide process control. As a result, all residues remaining on the wafer should be soluble in water. The wafer is then moved from chamber 80 to a rinsing station 82 for rinsing in DI water. After the rinsing step, the wafer can be put in a deposition chamber 84 for further processing.

This process is practical and desirable because it replaces the use of costly and hazardous acids and industrial organic solvents. Preferably, the plasma etching and RIE processes are performed in a single chamber, but they can be performed in separate chambers such that one chamber is used for performing plasma etching, and one chamber is used for performing the RIE step.

In a second embodiment used for via holes as illustrated in FIG. 2(*b*), the etching process can extend through ARC layer 68*b* and penetrate conductive layer 62*b*. In this case, the contamination of polymer layer 70*b* and photoresist 64*a* is much different from that described in connection with FIG. 2(*a*). Assuming conductive layer 62 is aluminum, etching causes back sputtering of $AlF_3$ and aluminum metal into polymer layer 70*b*. Aluminum metal is totally insoluble, and $AlF_3$ is only slightly soluble in warm water. Consequently, the inorganic aluminum residues remaining after a stripping process are not readily removed by rinsing in DI water, and have typically been removed with acids and organic solvents.

Referring again to FIG. 3, the following process avoids the need for such solvents. First, a dry plasma etching step, such as a Hal process or RIE process, is provided to the wafer in etching and cleaning chamber 80. Next, the wafer is removed from chamber 80 and provided to rinsing station 82 for a rinse in DI water, optionally with ultrasonic agitation. This rinsing step washes away the organic material, leaving only insoluble inorganic residues. Next, the wafer is returned to chamber 80 for a sputtering cleaning step with argon or some other gas used for sputtering. While sputtering by itself would not be a wholly effective for removing organic residues, the thorough removal of organic residues from the previous plasma etch and DI water rinse renders all of remaining residues removable by the sputtering step.

After these steps, the wafer is moved to a deposition chamber 84 for further processing. In known deposition chambers, a brief sputtering step is often first performed, prior to deposition to remove any oxides. The deposition chamber is not used for cleaning, however, because the byproducts would contaminate the environment; therefore, it is assumed that residues have already been removed with acids or solvents.

The processes noted above are described in more detail below. These processes may include several steps, the order of which may vary from one situation to another. For an RIE step, process variables are preferably as follows:

(1) Time duration of about 5–45 seconds.
(2) Pure $CF_4$ or mixtures of $CF_4$ with $N_2H_2$ at a gas flow from 50 to 500 sccm; 5%–100% volume ratio of $CF_4$.
(3) RF power levels from 50–500 watts.
(4) Pin position from 0–10 mm above hotplate.
(5) Temperature from ambient to 280° C.
(6) Pressure of 0.1 Torr to 0.5 Torr.

In this RIE process, $CF_4$ can be replaced with $NF_3$ or $Cl_2$, and $N_2H_2$ can be substituted with other gases such as $N_2$ or argon. The $N_2H_2$ can be from 0.1% to 10% $H_2$.

For the downstream plasma etching processes, the Hal process variables are preferably as follows:

(1) 1000 sccm oxygen.
(2) $CF_4$ from 5% to 50%.
(3) $N_2H_2$, a forming gas, from 5% to 50% in the mixture so that the ratio of $CF_4/N_2H_2$ can be from about 10:1 to about 1:20.

The preferred processing conditions for the argon sputtering are as follows:

(1) Argon gas at 20–500 sccm flow.

(2) RF power of 350–650 watts.

(3) Pressure of 10 mTorr to 500 mTorr.

(4) Hotplate temperature—ambient to 280° C.

(5) Added gases with $Cl_2$ or F, such as $NF_3$, $CF_4$, $CHF_3$ $Cl_2$, HCl, $CHCl_3$, or $C_2ClF_6$; and/or oxygen.

The argon-based plasma thus sputters off residues mainly by mechanical means to remove insoluble or nonvolatile residues. Gases containing $Cl_2$, F, or oxygen are preferably added to the argon to chemically enhance sputtering rates by converting the sputtered material to more volatile chlorides or fluorides. It has been found that a step of sputtering with argon, oxygen, and fluorine followed by a step of sputtering with argon and chlorine cleans particularly well. For some sputtering steps, such as sputtering with argon and chlorine, it may be important for the temperature to be sufficiently high for a given wafer.

Figure 4A:
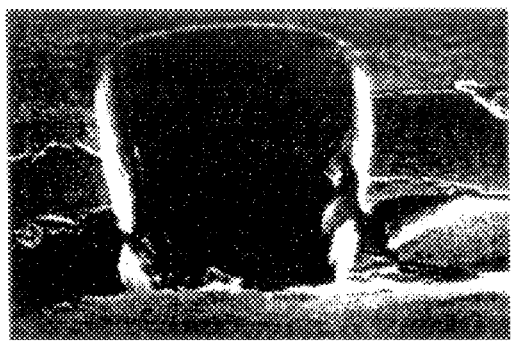
FIG. 4(a)–4(d) are SEM photographs of a via hole before ashing, after ashing, after rinse, and after sputtering, respectively.
Figure 4B:
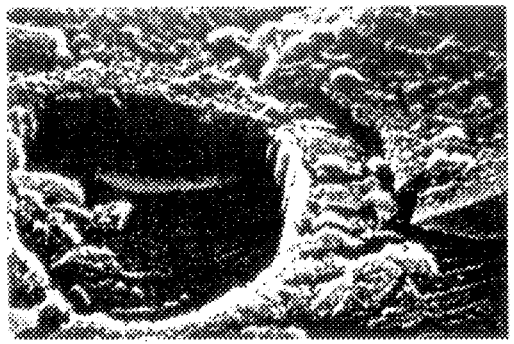
Figure 4C:
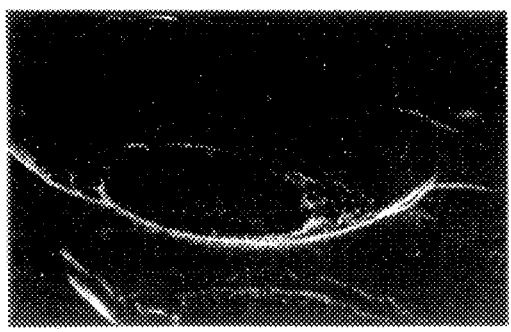
Figure 4D:
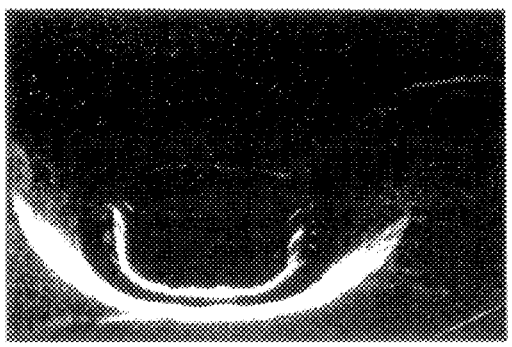

In one example shown in FIGS. 4(a)–4(d), a via hole was etched deeply into an aluminum layer as shown in FIG. 2(b), thus leaving polymer residues heavily contaminated with $AlF_3$ (FIG. 2(a)). The resist, including residues, were completely removed with a dry process having the following steps:

(1) hot $NF_3$ Hal step to remove bulk photoresist (FIG. 4(b));

(2) DI water rinse with ultrasonic agitation (FIG. 4(c)); and (3) argon sputter to produce a clean sample (FIG. 4(d)).

Having described embodiments of the present invention, it should be apparent that modifications can be made without departing from the scope of the appended claims. For example, while certain gases are recited, other gases can be used for removing resist.

What is claimed is:

1. A method for removing from a semiconductor device a resist layer having organic residues and inorganic residues, the method comprising:

(a) ashing the resist layer of the semiconductor device to form soluble organic compounds from the organic residues (b) rinsing the device in water to rinse away the soluble organic compounds; and (c) after ashing and rinsing, sputtering the device in an etching and stripping chamber to sputter away inorganic residues in the resist layer, thereby removing the resist layer.

2. The method of claim 1, wherein step (a) includes a downstream plasma etching process.

3. The method of claim 2, wherein step (a) is performed with a mixture of oxygen, a fluorine containing gas, and forming gas.

4. The method of claim 1, wherein step (a) includes a reactive ion etching process.

5. The method of claim 4, wherein step (a) is performed with a gas selected from the group consisting of $CF_4$, $NF_3$, a mixture of $CF_4$ and $N_2H_2$, and a mixture of $NF_3$ and $N_2H_2$.

6. The method of claim 1, wherein step (a) includes a reactive ion etching process and a downstream plasma etching process performed simultaneously.

7. A method for manufacturing semiconductor devices having a resist layer to be removed, the method comprising:

(a) ashing the resist layer of a semiconductor device to form organic compounds with a reactive ion etching process and a downstream plasma etching process performed sequentially;

(b) rinsing the device in water to rinse away the organic compounds; and (c) sputtering the device in an etching and stripping chamber to sputter away inorganic residues in the resist layer.

8. The method of claim 1, wherein step (b) includes rinsing with deionized water.

9. The method of claim 1, wherein step (c) includes sputtering with a gas including argon.

10. The method of claim 9, wherein step (c) includes sputtering with argon and a gas containing one of oxygen, chlorine, and fluorine.

11. The method of claim 9, wherein step (c) includes sputtering with argon and with a gas selected from the group consisting of oxygen, $NF_3$, $CF_4$, $CHF_3$ $Cl_2$, HCl, $CHCl_3$, and $C_2ClF_6$.

12. A method for manufacturing semiconductor devices having a resist layer to be removed, the method comprising:

(a) ashing the resist layer of a semiconductor device to form organic compounds;

(b) rinsing the device in water to rinse away the organic compounds; and (c) sputtering the device in an etching and stripping chamber to sputter away inorganic residues in the resist layer, the sputtering including a first step of sputtering with argon and oxygen, followed by a second step of sputtering with argon and chlorine.

13. The method of claim 1, wherein step (a) includes one of a downstream plasma etching process and a reactive ion etching process, step (b) includes rinsing with deionized water, and step (c) includes sputtering with argon gas.

14. The method of claim 1, the method further comprising, prior to step (a), the steps of:

forming a conductive layer;

forming a dielectric layer over the conductive layer;

forming a patterned resist layer in a pattern over the dielectric layer to produce exposed areas; and etching the exposed areas to produce via holes extending at least through the dielectric layer.

15. The method of claim 14, wherein the conductive layer includes aluminum, and the step of etching the exposed areas includes etching into the conductive layer with fluorine to produce $AlF_3$ as an inorganic residue.

16. The method of claim 14, further comprising the step of forming an anti-reflection coating (ARC) over the conductive layer, wherein the dielectric layer is formed on the ARC.

17. The method of claim 1, wherein steps (a) and (c) are performed in the same chamber.

18. The method of claim 1, wherein steps (a) and (c) are performed in different chambers.

19. The method of claim 7, wherein the sputtering includes sputtering with a gas including argon.

20. The method of claim 19, wherein the sputtering includes sputtering with argon and a gas containing one of oxygen, chlorine, and fluorine.

21. The method of claim19, wherein the sputtering includes sputtering with argon and with a gas selected from the group consisting of oxygen, $NF_3$, $CF_4$, $CHF_3$ $Cl_2$, HCl, $CHCl_3$, and $C_2ClF_6$.

22. The method of claim 19, wherein the sputtering includes first sputtering with argon and oxygen, followed by sputtering with argon and chlorine.

23. A method comprising:

forming a dielectric layer over a conductive layer;

forming a patterned resist layer over the dielectric layer to produce exposed areas;

etching the exposed areas to produce via holes extending through the dielectric layer and into the conductive layer so that the conductive material contaminates the resist layer;

ashing the resist layer to form soluble compounds;

rinsing away the soluble compounds; and sputtering the device in an etching and stripping chamber to sputter away nonsoluble residues remaining in the resist layer after the ashing and rinsing.

24. The method of claim 23, further comprising forming an antireflection coating on the conductive layer and forming the dielectric layer on the antireflection coating.

25. The method of claim 23, wherein the ashing includes microwave downstream process.

26. The method of claim 23, wherein the ashing includes an RIE process.

27. The method of claim 23, wherein the sputtering includes sputtering with a gas including argon.

* * * * *